United States Patent
Kobayashi et al.

(10) Patent No.: US 7,525,383 B2
(45) Date of Patent: Apr. 28, 2009

(54) DIFFERENTIAL AMPLIFIER

(75) Inventors: Shigeto Kobayashi, Gifu (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/902,557

(22) Filed: Sep. 24, 2007

(65) Prior Publication Data

US 2008/0079492 A1    Apr. 3, 2008

(30) Foreign Application Priority Data

Sep. 29, 2006   (JP)   ............... 2006-266815
Aug. 2, 2007   (JP)   ............... 2007-202287

(51) Int. Cl.
   *H03F 3/45*   (2006.01)
(52) U.S. Cl. .................. 330/261; 330/253
(58) Field of Classification Search ........... 330/261, 330/51, 253; 327/52
   See application file for complete search history.

(56) References Cited

U.S. PATENT DOCUMENTS 6,326,846 B1 * 12/2001 Brandt ................. 330/253
7,443,234 B2 * 10/2008 Iriguchi ................. 330/9

FOREIGN PATENT DOCUMENTS

JP    07-066727   3/1995
JP    11-112305   4/1999

OTHER PUBLICATIONS

Japanese Office Action, with English Translation, issued in Japanese Patent Application No. JP 2007-202287 dated on Oct. 28, 2008.

* cited by examiner

*Primary Examiner*—Robert Pascal
*Assistant Examiner*—Hieu P Nguyen
(74) *Attorney, Agent, or Firm*—McDermott Will & Emery LLP (57) ABSTRACT

Connected to a differential transistor pair are a load current source and a tail current source. A bias circuit controls current generated by the load current source. A first self-bias switch is provided between a gate and a drain of a first input transistor; and a second self-bias switch is provided between a gate and a drain of a second input transistor, where the first input transistor and the second input transistor constitute the differential transistors pair. An external bias switch is provided between the bias circuit and the load current source.

9 Claims, 10 Drawing Sheets

DIFFERENTIAL AMPLIFIER

CROSS-REFERENCE TO RELATED APPLICATIONS

This application is based upon and claims the benefit of priority from the prior Japanese Patent Application No. 2006-266815, filed on Sep. 29, 2006, and Japanese Patent Application No. 2007-202287, filed on Aug. 2, 2007, the entire contents of which are incorporated herein by reference.

BACKGROUND OF THE INVENTION

1. Field of the Invention

The present invention relates to a differential amplifier that amplifies or compares an inputted voltage.

2. Description of the Related Art

In recent years, along with the progress in a digital processing technology of video signals there is a growing demand of high performance in an analog-to-digital converter circuit (hereinafter referred to as "A/D converter" also) used in the video signal processing. As an A/D converter that meets this demand, an A/D converter of a pipeline type has been utilized.

The pipeline type A/D converter is configured by including a sub-A/D converter and a digital-to-analog converter circuit (hereinafter referred to as "D/A converter" also). The sub-A/D converter is of a flash type, capable of performing high-speed conversion, where comparators are all connected in parallel. The sub-A/D converter is configured by including a plurality of differential comparators that compare a plurality of reference voltages with an input voltage. The conventional differential comparator is configured such that the switches within a circuit are CMOS switches (transfer gates). In such CMOS switches, parasitic capacitances exist between sources and gates or between gates and drains. Hence, switching noise dependent on the input voltage occurs when the switch is turned on and off. Then a problem arises where this switching noise is transferred to an output by way of the parasitic capacitance.

SUMMARY OF THE INVENTION

The present invention has been made in view of the foregoing circumstances and a general purpose thereof is to provide a differential amplifier capable of reducing the effect of noise and also operating at high speed.

A differential amplifier according to one embodiment of the present invention comprises: a differential transistor pair; at least one current source connected to the differential transistor pair; a bias circuit which supplies a bias voltage to the current source and which controls current generated by the current source; a first self-bias switch and a second self-bias switch each provided between an input terminal and an output terminal of each of transistors that constitute the differential transistor pair; and an external bias switch provided on a path of bias voltage supplied from the bias circuit to the current source.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of examples only, with reference to the accompanying drawings which are meant to be exemplary, not limiting and wherein like elements are numbered alike in several Figures in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

A differential amplifier according to one embodiment of the present invention comprises: a differential transistor pair; at least one current source connected to the differential transistor pair; a bias circuit which supplies a bias voltage to the current source and which controls current generated by the current source; a first self-bias switch and a second self-bias switch each provided between an input terminal and an output terminal of each of transistors that constitute the differential transistor pair; and an external bias switch provided on a path of bias voltage supplied from the bias circuit to the current source.

According to this embodiment, the bias state of the differential transistor pair can be switched between a state controlled by the bias voltage from the bias circuit and a state controlled by the self-bias. Thus, in a period during which noise occurs at an input terminal, a self-bias switch is turned on to stabilize the bias state and at the same time the effect of noise can be reduced by fixing an output voltage. In this period, if the external bias switch is turned off, the bias circuit can be prevented from suffering from the effect of the self-biased current source. In a period during which noise does not cause any problem, if the external bias switch is turned on, the differential transistor pair can be immediately transited to a predetermined bias state. Hence, the primary function of a differential amplifier can be achieved.

The external bias switch may be provided between the supply source functioning as a load of the differential transistor pair and the bias circuit. In such a case, if the external bias switch is turned off while the current source is being self-biased, the load current source and the bias circuit can be separated off from each other. As a result, the bias circuit can be prevented from being affected by the load current source.

In a preferred embodiment of the present invention, the current source functioning as a load of the pairs of differential transistors may include a load transistor pair where a control terminal is connected in common, and the external bias switch may be provided between the control terminal of the load transistor connected in common and the bias circuit. The differential amplifier may further comprise: a third self-bias switch provided between the control terminal of the load transistor pair in common and an output terminal of one of transistors that constitute the differential transistor pair; and a fourth self-bias switch provided between the control terminal of the load transistor pair in common and an output terminal of the other of transistors that constitute the differential transistor pair.

With the provision of the third and fourth self-bias switches, the potential of the control terminal of the load transistor pair can be directly set equal to the potential of the input terminal and the output terminal while the other self-bias switches are turned on. As a result, a more stable self-bias state can be realized.

The external bias switch may be provided between the current source functioning as a tail current source of the differential transistor pair and the bias circuit.

In such a case, if the external bias switch is turned off in a state where the current source is controlled by the self-bias, the tail current source and the bias circuit can be separated off from each other. As a result, the bias circuit can be prevented from being affected by the tail current source.

In a preferred embodiment, the first self-bias switch and the second self-bias switch may be turned on and the external bias switch may be turned off in a predetermined self-bias period and, in a predetermined amplifying period thereafter, the first self-bias switch and the second self-bias switch may be turned off and the external bias switch may be turned on.

In such a case, a period in which the input noise occurs is set to the self-bias period, so that an optimum signal processing where the effect of noise is suppressed can be achieved. When switched to the amplifying period, amplifying processing can be executed immediately. In this patent specification, the term "amplifying" is used in a sense that it includes not only a primary meaning of amplifying the signals but also a voltage comparison.

Another embodiment of the present invention relates to a switched-capacitor circuit. This switched-capacitor circuit comprises: a differential amplifier according to any of the above-described embodiments; an input capacitor connected to an input terminal; and an input switch which is on-off controlled by the input capacitor wherein one end of the input switch is connected to the input capacitor.

According to this embodiment, the effect of noise caused by the on and off of the input switch connected to the input terminal of the differential amplifier can be reduced.

A description is now given of preferred embodiments of the present invention with reference to drawings.

Figure 1:
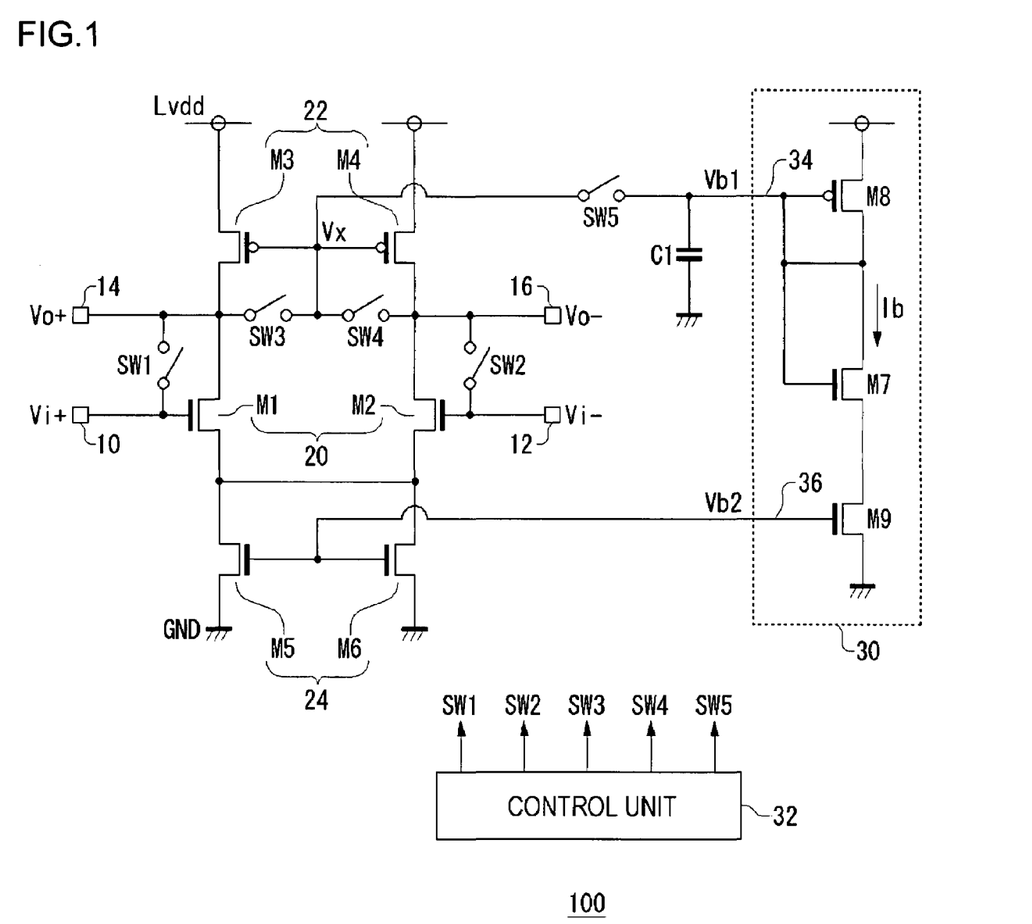
FIG. 1 is a circuit diagram showing a structure of a differential amplifier according to an embodiment of the present invention.

FIG. 1 is a circuit diagram showing a structure of a differential amplifier 100 according to an embodiment of the present invention. The differential amplifier 100 is comprised of a differential transistor pair 20, a load current source 22, a tail current source 24, a bias circuit 30, a control unit 32, a group of self-bias switches SW1 to SW4, and an external bias switch SW5. The differential amplifier 100 amplifies (or compares the voltages of) differential input voltages Vi+ and Vi− inputted to a first input terminal 10 and a second input terminal 12, respectively, and then outputs differential output voltages Vo+ and Vo− obtained as a result thereof from a first output terminal 14 and a second output terminal 16, respectively. It is to be noted here that differential amplifier 100 may function as a stand-alone comparator or amplifier or may be used as an inputting stage of an operational amplifier. A description will be given hereinbelow in such a manner that the differential amplifier 100 functions as a comparator that compares the differential input voltages Vi+ and Vi−.

The differential transistor pair 20 include a first input transistor M1 and a second input transistor M2. The first input transistor M1 and the second input transistor M2 are each an N-channel MOSFET (Metal Oxide Semiconductor Field Effect Transistor), and gates thereof, which are control terminals thereof, are connected to the first input terminal 10 and the second input terminal 12, respectively. Sources of the first input transistor M1 and the second input transistor M2 are connected in common. Connected to the differential transistor pair 20 are two current sources, namely, the load current source 22 and the tail current source 24.

The load current source 22 functions as a constant-current load of the differential transistor pair 20. The load current source 22 includes a first load transistor M3 and a second load transistor M4 which are P-channel MOSFETs. Drains of the first load transistor M3 and the second load transistor M4 are connected with drains of the first input transistor M1 and the second input transistor M2, respectively. Sources of the first load transistor M3 and the second load transistor M4 are connected to a power supply line Lvdd from which supply voltage that is a first fixed potential is supplied. The potential of gates of the first load transistor M3 and the second load transistor M4 are controlled by a first bias voltage Vb1 outputted from the bias circuit 30.

The tail current source 24 is provided between the differential transistor pair 20 and a ground line GND where a ground potential that is a second fixed potential is supplied. The tail current source 24 includes a first tail transistor M5 and a second tail transistor M6 which are N-channel MOSFETs. Sources, gates and drains of the first tail transistor M5 and the second tail transistor M6 are connected in common, and the sources are grounded and the drains thereof are connected with the sources of the first input transistor M1 and the second input transistor M2. A second bias voltage Vb2 generated by the bias circuit 30 is supplied to the gates of the first tail transistor M5 and the second tail transistor M6. The first tail transistor M5 and the second tail transistor M6 may be formed as a single transistor.

The bias circuit 30 generates the above-described first bias voltage Vb1 and the second bias voltage Vb2 and controls the bias states of the load current source 22 and the tail current source 24. According to the present embodiment, the bias circuit 30 includes a first bias transistor M7, a second bias transistor M8, and a third bias transistor M9. The first bias transistor M7 is of the same type as the first input transistor M1 and the second input transistor M2, namely, an N-channel MOSFET. The second bias transistor M8 is of the same type as the first load transistor M3 and the second load transistor M4, namely, a P-channel MOSFET. The third bias transistor M9 is of the same type as the first tail transistor M5 and the second tail transistor M6, namely an N-channel MOSFET. The second bias transistor M8, the first bias transistor M7 and the third bias transistor M9 are connected in series on a path leading from the supply line Lvdd to the ground line GND.

More specifically, a source of the second bias transistor M8 is connected to the supply line Lvdd, and drain and gate of the second bias transistor M8 are connected in common. Gate and drain of the first bias transistor M7 are connected to the gate and the drain of the second bias transistor M8. A source of the third bias transistor M9 is grounded, and a drain thereof is connected with a source of the first bias transistor M7. The potential of the gate of the second bias transistor M8 is outputted as the first bias voltage Vb1, and the potential of a gate of the third bias transistor M9 is outputted as the second bias voltage Vb2. Hereinafter, the gate of the second bias transistor M8 will be called a first output terminal 34, and the gate of the third bias transistor M9 will be called a second output terminal 36.

The second bias transistor M8, the first bias transistor M7 and the third bias transistor M9 are configured as replicas equivalent to a path formed by including the first load transistor M3, the first input transistor M1 and the first tail transistor M5 or a path formed by including the second load transistor M4, the second input transistor M2 and the second tail transistor M6. Corresponding transistors are formed in pairs. A stabilizing capacitor C1 is provided between the first output terminal 34 of the bias circuit 30 and ground. The first bias voltage Vb1 is stabilized by the stabilizing capacitor C1.

From another point of view, the second bias transistor M8 is connected to the first load transistor M3 and the second load transistor M4 in a current-mirror configuration, whereas the third bias transistor M9 is connected to the first tail transistor M5 and the second tail transistor M6 in a current-mirror configuration. A current, proportional to a bias current Ib flowing through the second bias transistor M8 and the third bias transistor M9, flows through the first load transistor M3, the second load transistor M4 and the first tail transistor M5 and the second tail transistor M6.

A group of self-bias switches SW1 to SW4, which are CMOS switches, namely, transfer gates, are provided for self-biasing the load current source 22. A first self-bias switch SW1 is provided between the gate (i.e., input terminal) and the drain (i.e., output terminal) of the first input transistor M1, namely, between the first input terminal 10 and the first output terminal 14. A second self-bias switch SW2 is provided between the gate and the drain of the second input transistor M2, namely, between the second input terminal 12 and the second output terminal 16. The first self-bias switch SW1 and the second self-bias switch SW2 couples the gates and drains of the first input transistor M1 and second input transistor M2 respectively so that the potentials at the gates and drains thereof are each equal when they are ON.

The third self-bias switch SW3 is provided between the gate of the load transistor pair 22 connected in common and the output terminal (drain) of the first input transistor M1. Also, the fourth self-bias switch SW4 is provided between the gate of the load transistor pair 22 connected in common and the output terminal (drain) of the second input transistor M2. Here, the first input transistor M1 and the second input transistor M2 constitute the differential transistor pair 20. The first load transistor M3 and the second load transistor M4 couple the gates and the drains of the first load transistor M3 and the second load transistor M4 so that the potentials at the gates and drains thereof are each equal when they are ON.

The external bias switch SW5 is provided between the load current source 22 and the bias circuit 30. More specifically, one end of the external bias switch SW5 is connected to the output terminal 34 of the bias circuit 30, namely, the gate of the second bias transistor M8. The other end of the external bias switch SW5 is connected to the gates of the first load transistor M3 and the second load transistor M4, connected in common, which constitute the load current source 22. When the external bias switch SW5 is ON, the first bias voltage Vb1 generated by the bias circuit 30 is supplied to the load current source 22, and the bias states of the first load transistor M3 and the second load transistor M4 are controlled.

The control unit 32 controls the on-off states of the self-bias switches SW1 to SW4 and the external bias switch SW5. In a first state, the control unit 32 turns on the self-bias switches SW1 to SW4 and turns off the external bias switch SW5. In a second state, the control unit 32 turns off the self-bias switch SW1 to SW4 and turns on the external bias switch SW5.

Figure 2:
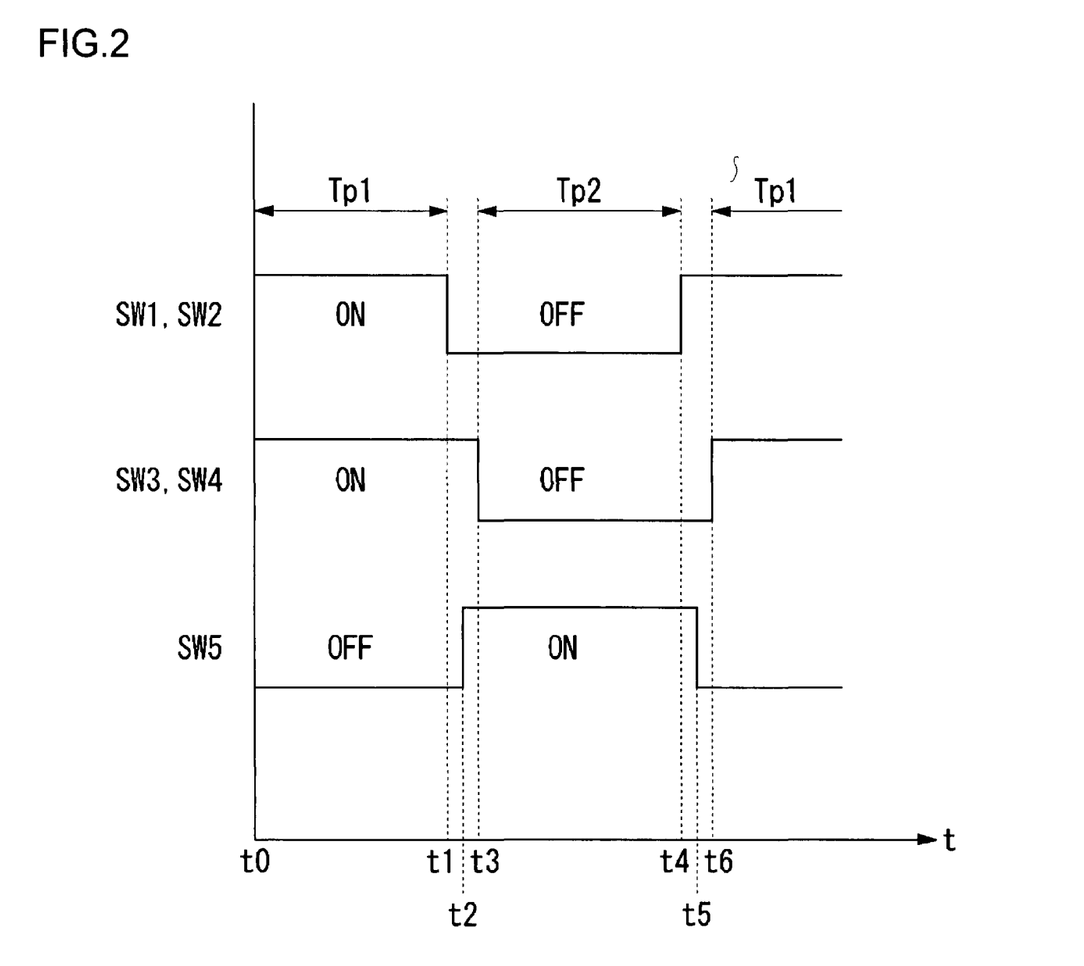
FIG. 2 is a timing chart showing an operating state of a differential amplifier shown in FIG. 1.

An operation of the differential amplifier 100 structured as above will now be described. FIG. 2 is a timing chart showing an operating state of the differential amplifier 100 shown in FIG. 1. Prior to the signal processing for the input voltages Vi+ and Vi-, the differential amplifier 100 is set to a first state during a self-bias period Tp1 of time t0 to t1. In the first state, the first self-bias switch SW1, the second self-bias switch SW2, the third self-bias switch SW3 and the fourth self-bias switch SW4 are each set to the ON state, whereas the external bias switch SW5 is set to off. By turning on the first self-bias switch SW1 and the second self-bias SW2, the potentials of the drains of the first input transistor M1 and the second input transistor M2 are nearly equal to the input voltages Vi+ and Vi-, respectively. "Nearly equal" means that a potential difference which is equivalent to a voltage drop across the transfer gate occurs.

Further, in the first state, the third self-bias switch SW3 and the fourth self-bias switch SW4 are turned on, so that the potentials of the gates and drains of the first load transistor M3 and the second load transistor M4 are nearly equal to each other. As a result, the first load transistor M3 and the second load transistor M4 are in a self-biased state.

During this time, the bias circuit 30 generates the first bias voltage Vb1 and the second bias voltage Vb2. Here, since the external bias switch SW5 is being turned off, the first bias transistor M7 to the third bias transistor M9 are stabilized without the effect of a self-biased load current source 22 side and continue to generate a predetermined first bias voltage Vb1 and a predetermined second bias voltage Vb2.

During the self-bias period Tp1, the third self-bias switch SW3 and the fourth self-bias switch SW4 are being turned on, so that the output voltages Vo+ and Vo- of the first output terminal 14 and the second output terminal 16 are nearly equal to each other. Thereby, the noise will not be outputted as the output voltage Vo+ and Vo-, so that the effect of noise can be reduced.

At time t1, the control unit 32 first switches the self-bias switches SW1 and SW2 to OFF states and thereby the input voltage Vi is sampled. Then, at time t2, the external bias switch SW is switched to an ON state. As a result, the first load transistor M3 and the second load transistor M4 transit immediately from the self-biased state to a bias state determined by the first bias voltage Vb1 outputted from the bias circuit 30.

After transiently occurring noise N has disappeared, the control unit 32 switches the third self-bias switch SW3 and the fourth self-bias switch SW4 to the OFF states at time t3, so that the transition is made to an amplifying period Tp2. When the tail current source 24 and the load current source 22 are biased stably by the bias circuit 30, the output of the output voltages Vo+ and Vo- corresponding to the input voltages Vi+ and Vi- is started.

When the primary amplifying operation or the comparison operation of the differential amplifier 100 is performed, the switching is made again to the self-bias period Tp1 prior to the subsequent amplifying operation or comparison operation. In such a case, at time t4 the self-bias switches SW1 and SW2 are first switched to ON states. Then, at time t5, the external bias switch SW5 is switched to an OFF state. Then, at time t6, the self-bias switches SW3 and SW4 are switched to ON and thereby the load transistor M3 and the second load transistor M4 of the load current source 22 are self-biased.

Advantages of the differential amplifier 100, according to the present embodiment, which operates as above will now be discussed. In the present embodiment, the external bias switch SW5 is provided and this external bias switch SW5 is set to OFF in the self-bias period Tp1. To further clarify the advantage of this external bias switch SW5, an operation in the case when no external bias switch SW5 is provided is examined as follows.

Since the first self-bias switch SW1 to the fourth self-bias switch SW4 are turned on in the self-bias period Tp1, a voltage nearly equal to the input voltage Vi+ and Vi− is applied to the gates of the first load transistor M3 and the second load transistor M4. Suppose that no external bias switch SW5 is provided. Then this voltage is applied to the gate of the second bias transistor M8 and therefore the operating state of the second bias transistor M8 is influenced by a load current source 22 side. As a result, the value of the first bias voltage Vb1 will be different from the value that should be generated in the amplifying period during which the differential amplifier 100 achieves its primary function. Thereafter, when the first self-bias switch SW1 to the fourth self-bias switch SW4 are turned off, the first bias voltage Vb1 transits from a state, which is stabilized to a value different from a predetermined value, to a value which is to be generated primarily. A certain transition time is required for this transition, so that the differential amplifier 100 cannot execute the primary amplifying function or the comparison function during this transition time.

If, alternatively, the amplifying processing or comparison processing is executed in a circuit where no external bias switch SW5 is provided while the first bias voltage Vb1 remains set to a value different from the value that should be primarily set, a difference will occur in between the current flowing through the load current source 22 and the current flowing through the tail current source 24. This may cause a common voltage of the output voltages Vo+ and Vo− to lie in a region where the gain of a comparator is markedly lowered.

In contrast thereto, in the differential amplifier 100 according to the present embodiment the external bias switch SW5 is provided between the load current source 22 and the bias circuit 30 and this external bias switch SW5 is turned off during the self-bias period Tp1. Thereby, the potential of the second bias transistor M8, namely, the first bias voltage Vb1 can be stabilized to a value which should be generated in the first place. As a result, when switching is made from the self-bias period Tp1 to the amplifying period Tp2, the bias state of the load current source 22 can be transited immediately to a proper stabilized voltage level. In other words, the period of time required until the bias state is stabilized can be reduced, so that a high-speed operation can be realized.

Also, the stabilizing capacitor C1 is provided at the first output terminal of the circuit 30 where the first bias voltage Vb1 is outputted. Thereby, even if the external bias switch SW5 is switched from OFF to ON, the variation in the first bias voltage Vb1 can be suppressed and therefore a configuration advantageous to realize the high-speed operation is provided.

Figure 3:
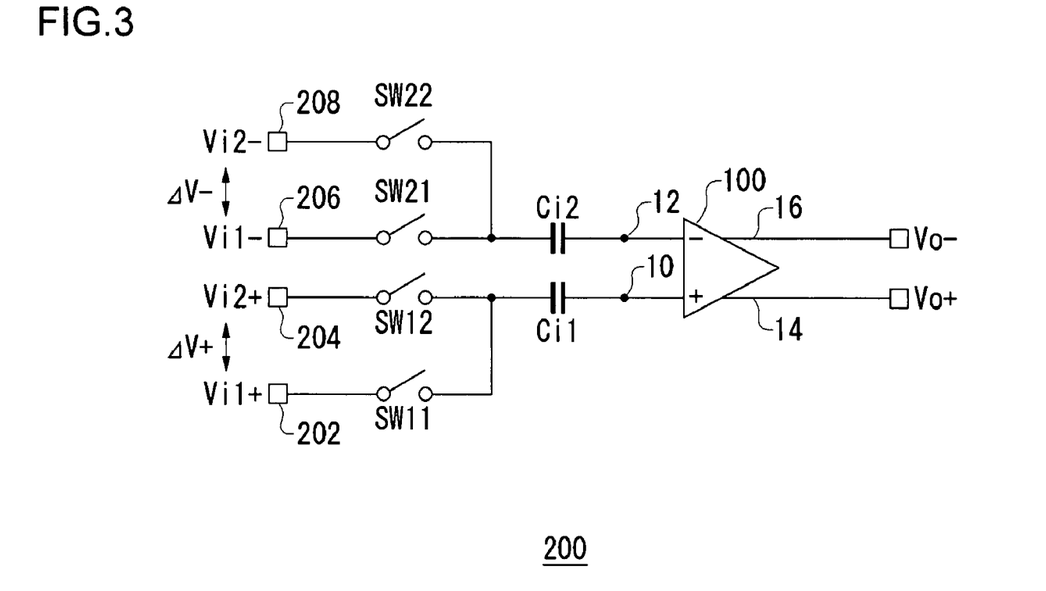
FIG. 3 is a circuit diagram showing a structure of a comparator including a differential amplifier shown in FIG. 1.

A description is now given of a functional circuit using the differential amplifier 100 structured as above. FIG. 3 is a circuit diagram showing a structure of a comparator 200 that includes the differential amplifier 100 as shown in FIG. 1. The comparator 200, which is a switched-capacitor comparator, includes the differential amplifier 100 of FIG. 1, input switches SW11, SW12, SW21 and SW22, and input capacitors Ci1 and Ci2.

Input voltages Vi1+, Vi2+, Vi1− and Vi2− are inputted to input terminals 202, 204, 206 and 208 of the comparator 200, respectively. An output-side one end of a first input capacitor Ci1 and that of a second input capacitor Ci2 are connected to a first input terminal 10 and a second input terminal 12 of the differential amplifier 100, respectively.

One ends of the input switches SW11 and SW12 are connected respectively to the input terminals 202 and 204, whereas the other ends thereof are connected to an input-side terminal of the first input capacitor Ci1. Similarly, one ends of the switches SW21 and SW22 are connected respectively to the input terminals 206 and 208, whereas the other ends thereof are connected to the second input capacitor Ci2.

Figure 4:
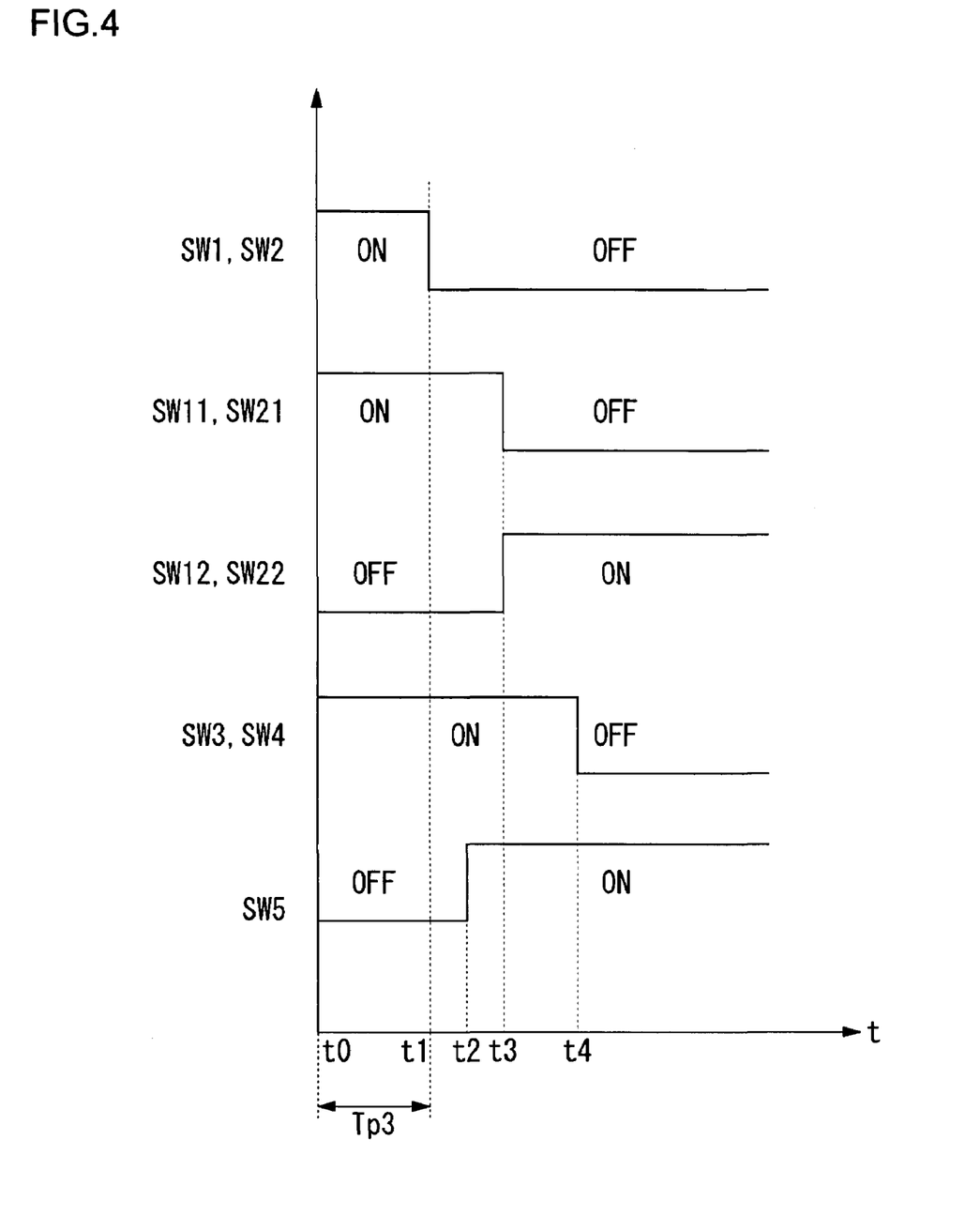
FIG. 4 is a timing chart showing an operation state of a comparator shown in FIG. 3.

An operation of the comparator 200 structured as above is described. FIG. 4 is a timing chart showing an operation state of a comparator shown in FIG. 3. First, during an auto-zero period Tp3 from time t0 until time t1, the self-bias switches SW1 to SW4 are each set to an ON state and the external bias switch SW5 is set to an OFF state. At this time, the load current source 22 is self-biased and the output voltages Vo+ and Vo− are equally set to an auto-zero voltage Vaz determined by a self-bias state.

During this auto-zero period Tp3, the input switches SW11 and SW21 are set to ON states and the input voltages Vi1+ and Vi1− are applied respectively to one ends of the first input capacitor Ci1 and the second input capacitor Ci2. At time t1, the self-bias switches SW1 and SW2 are switched to OFF, thus completing the auto-zero period Tp3. The input voltages Vi+ and Vi− are sampled by turning off the self-bias switches SW1 and SW2.

Subsequently, at time t2, the external bias switch SW5 is switched to ON and thereby the self-biased state thus far is switched to a bias state determined by the bias circuit 30.

Subsequently, at time t3, the input switches SW11 and SW21 are turned off and the input switches SW12 and SW22 are turned on. Since a capacitance Cx including a gate capacitance of the first input transistor M1 is present at the first input terminal 10, the potential of the first input terminal 10 varies by $\Delta V = \{(Vi2+) - (Vi1+)\} \times Ci1/Cx$. Similarly, the potential of the second input terminal 12 varies by $\Delta V = \{(Vi2-) - (Vi1-)\} \times Ci2/Cx$. With the on-off switching of the input switches SW11, SW21, SW12 and SW22 at time t2, the switching noise occurs at the first input terminal 10 and the second input terminal 12. However, as described above, this noise does not appear in the output voltages Vo+ and Vo−.

Subsequently, at time t4 when the occurrence of the switching noise stops, the self-bias switches SW3 and SW4 are switched to OFF. As a result, the sizes of the voltage changes ΔV appearing at the first input terminal 10 and the second input terminal 12 are compared, and output voltages Vo+ and Vo− according to a magnitude relation are outputted. In the timing chart of FIG. 4, the external bias switch SW5 is turned on before the switching of the input switches SW11 to SW22. However, the external bias switch SW5 may be turned on after the switching of the input switches SW11 to SW22.

In the timing chart of FIG. 4, the auto-zero period Tp3 from time t0 until time t1 corresponds to the self-bias period Tp1 in the timing chart of FIG. 2, whereas a period from time t4 onward in FIG. 4 corresponds to the amplifying period Tp2 in the timing chart of FIG. 2. The differential amplifier 100 of FIG. 1 is used in the comparator 200 which is a switched-capacitor circuit as shown in FIG. 3. Thereby, the noise that occurs due to the on-off switching of the input switches SW11, SW12, SW21 and SW22 provided for charging and discharging an electric charge for the input capacitor, namely, the effect of output voltages Vo+ and Vo− can be optimally suppressed as a result of the voltage comparison.

Further, in the auto-zero period, by turning off the external bias switch SW5 in the differential amplifier 100, the first bias voltage Vb1 of the bias circuit 30 is free from the effect of the auto-zero voltage Vaz. And by switching the external bias switch to ON at time t3, the gate voltage of the first load transistor M3 and the second load transistor M4 of the load current source 22 can be stabilized to the first bias voltage Vb1 in a short time, so that fast voltage comparison can be performed.

Figure 5:
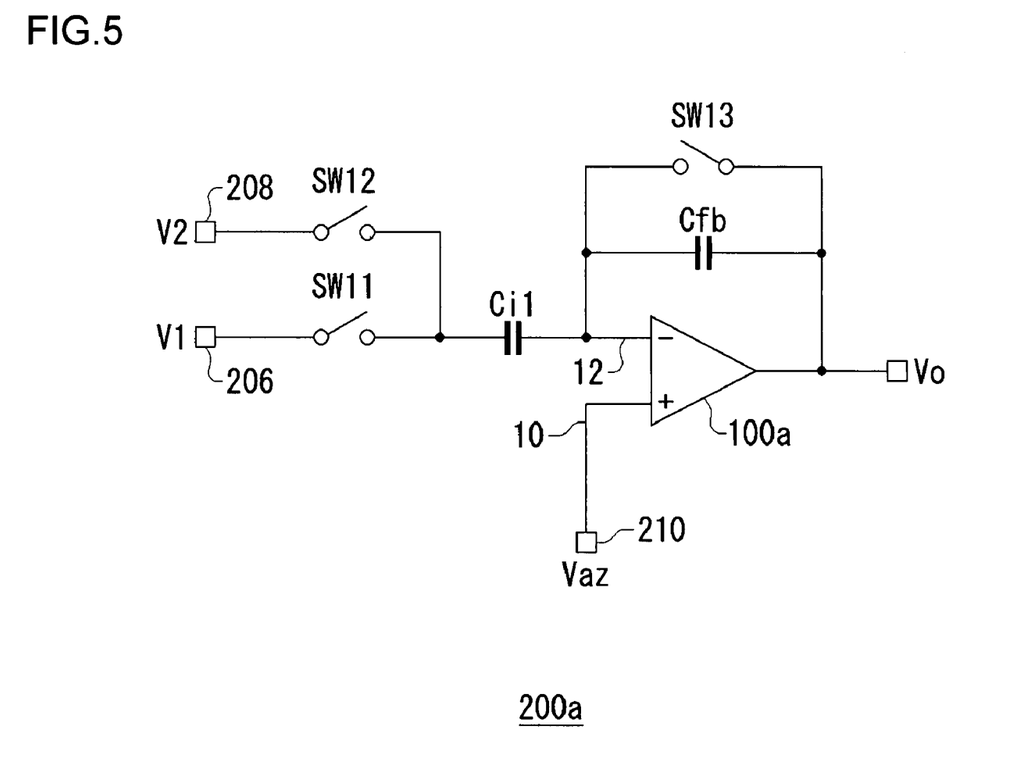
FIG. 5 is a circuit diagram showing a structure of an inverting amplifier using a differential amplifier shown in FIG. 1.

FIG. 5 a circuit diagram showing a structure of another switched-capacitor circuit using the differential amplifier 100 shown in FIG. 1. The switched-capacitor circuit shown in FIG. 5 is an inverting amplifier of switched-capacitor type. An inverting amplifier 200a includes an operational amplifier 100a, input switches SW11 and SW12, an input capacitor Ci1, a feedback capacitor Cfb, and an initialization switch SW13. This initialization switch SW13 is the first self-bias switch SW1 or second self-bias switch SW2 as shown in FIG. 1.

The differential amplifier 100 of FIG. 1 is provided in the input stage of the operational amplifier 100a. The connection configuration of the input capacitor Ci1 and the input switches SW11 and SW12 are similar to that of the comparator 200 shown in FIG. 3. The auto-zero voltage Vaz is supplied to a first input terminal 10 which is a noninverting input terminal of the differential amplifier 100a. The feedback capacitor Cfb is provided between an output terminal and a second input terminal 12 of the operational amplifier 100a, and the initialization switch SW13 is provided in parallel with the feedback capacitor Cfb. Though the amplifier of FIG. 5 is shown as a single-end type, it may have a differential output.

An operation of the inverting amplifier 200a of FIG. 5 is now described. First, the initialization switch SW13, namely the self-bias switches SW1 and SW2, are turned on; an electric charge stored in the feedback capacitor Cfb is initialized; and the potentials of the output voltage Vo and the second input terminal 12 are each set equal to the auto-zero voltage Vaz. When the initialization of the feedback capacitor Cfb has been completed, the initialization switch SW13 is turned off.

Subsequently, the input switch SW1*l* is turned on and the input switch SW12 is turned off, so that an input voltage V1 is applied to an input-side terminal of the input capacitor Ci1. As a result, an electric charge Q1 according to a difference between the auto-zero voltage Vaz and the input voltage V1 is stored in the input capacitor Ci1.

Subsequently, the input switch SW11 is turned off and the input switch SW12 is turned on, so that an input voltage V2 is applied to an input-side terminal of the input capacitor Ci1. As a result, an electric charge Q1' according to a difference between the auto-zero voltage Vaz and the input voltage V2 is stored in the input capacitor Ci1.

When the electric charge of the input capacitor Ci1 changes from Q1 to Q1', the electric charge of the feedback capacitor Cfb changes in a manner that the electric charge of the second input terminal 12 is maintained at the auto-zero voltage Vaz. As a result, a voltage variation $\Delta Vo = Cfb/Cin1 \times (V1-V2)$ occurs in the output voltage Vo and therefore a voltage equivalent to the difference between the input voltages V1 and V2 is amplified.

In a period during which the on and off of the input switches SW11 and SW12 are switched, the self-bias switches SW1 to SW4 are turned on and the external bias switch SW5 provided between the bias circuit 30 and the load current source 22 is turned off. This can suppress the effect of noise from appearing in the output voltage Vo in the inverting amplifier 200a of FIG. 5.

In this manner, the differential amplifier 100 according to the present embodiment can be suitably used for a circuit, as shown in FIG. 3 or FIG. 5, where the switches are provided in the input, particularly for a switched-capacitor circuit. Further, an A/D converter may be configured by the use of the differential amplifier 100 of FIG. 1 or the comparator 200 of FIG. 3. That is, in an embodiment of the present invention there is provided an A/D converter. This A/D converter includes a plurality of comparators which compare input voltages to be A/D converted, with reference voltages set respectively. Each comparator has a structure equivalent to that of differential amplifier 100 of FIG. 1 or the comparator 200 of FIG. 3. According to this embodiment, after the bias is given to each differential amplifier 100 using the auto-zero voltage Vaz, a transition can be made immediately to an voltage comparison operation. Hence, high-speed A/D conversion is possible.

Figure 6:
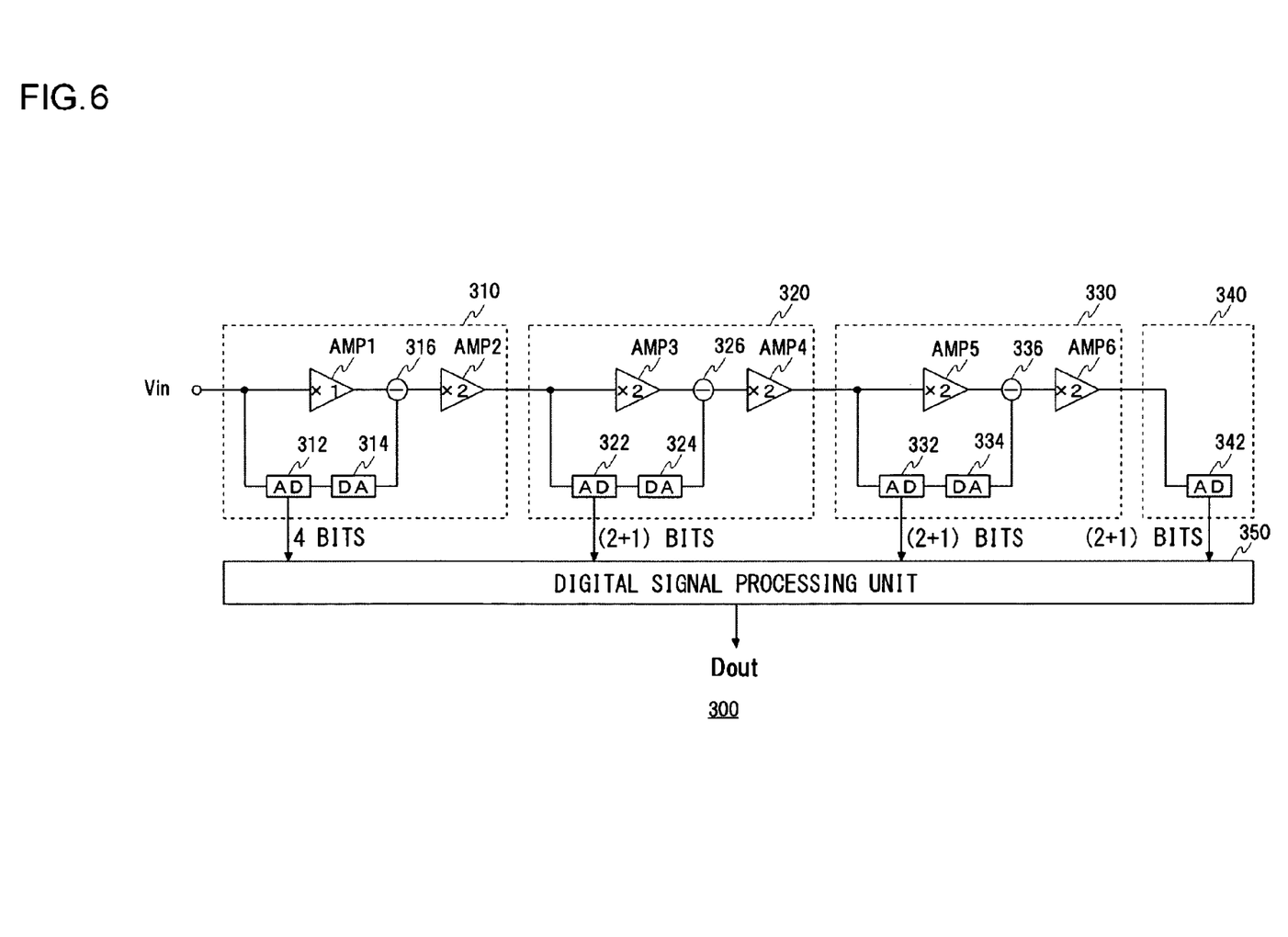
FIG. 6 is a block diagram showing a structure of an A/D converter which may use a differential amplifier of FIG. 1 and/or a comparator of FIG. 3.

FIG. 6 is a block diagram showing a structure of an A/D converter which may use the differential amplifier 100 of FIG. 1 and/or the comparator 200 of FIG. 3. The A/D converter 300 is a pipeline type A/D converter and is provided with four stages 310, 320 330 and 340. The first stage 310 converts 4 bits, whereas the second stage 320, the third stage 330 and the fourth stage 340 each converts 2 bits excluding the redundancy 1 bit. Thus, this pipeline type A/D converter 300 converts the total of 10 bits. Note that the number of stages or the number of bits are merely exemplary here and these should not be considered as limiting.

The first stage 310 includes a first sub-A/D converter circuit 312, a first D/A converter circuit 314, a first subtraction circuit 316, a first amplifier circuit AMP1, and a second amplifier circuit AMP2. The first sub-A/D converter circuit 312 and the first amplifier circuit AMP1 sample an input analog signal Vin practically at the same timing. The structure of the first sub-A/D converter circuit 312 is of a flash type. As described above, the resolution is 4 bits.

The first sub-A/D converter circuit 312 converts the components corresponding to the upper 4 bits in the sampled signal, into digital values so as to be outputted to the first D/A converter circuit 314 and a digital signal processing unit 350. The first D/A converter circuit 314 converts the digital values which have been converted by the first sub-A/D converter circuit 312, into an analog value. This analog signal is a signal which is to be removed from the analog signals which are to be converted by the first sub-A/D converter circuit 312.

The first subtraction circuit 316 subtracts the analog signal converted by the first D/A converter circuit 314, from the input analog signal Vin which has been sampled by the first amplifier circuit AMP1. The second amplifier circuit AMP2 amplifies a residual signal obtained by subtracting the former from the latter, by a predetermined gain and then outputs the amplified residual signal to the second stage 320. Here, the signal is amplified by a factor of 2. The amplified residual signal is to be converted at the second stage 320.

The second stage 320 includes a second sub-A/D converter circuit 322, a second D/A converter circuit 324, a second subtraction circuit 326, a third amplifier circuit AMP3 and a fourth amplifier circuit AMP4. The second stage 320 is configured in a similar manner to the first stage 310.

The structure of the second sub-A/D converter circuit 322 is of a flash type. As described above, the resolution is 3 bits if the redundancy 1 bit is included. If the same reference voltage range as that of the first sub-A/D converter circuit 312 is set for the second sub-A/D converter circuit 322, the output signal at the first stage 310 will have to be amplified by a factor of 22 since the number of bits to be converted by the second sub-A/D converter circuit 322 is 2. That is, if it is not amplified by a factor of 4, the range of the residual signal inputted to the second sub-A/D converter circuit 322 from the first stage will not match with and thus deviate from the reference voltage range of the second sub-A/D converter circuit 322.

Accordingly, the third amplifier circuit AMP3 amplifies the residual signal by a factor of 2 only. In the light of this, the reference voltage set for each comparator provided in the second sub-A/D converter circuit 322 is set to ½ of that of the first sub-A/D converter circuit 312, whereas the reference voltage range of the second sub-A/D converter circuit 312 is set to ½ of that of the first sub-A/D converter circuit 312. As a result, the range of residual signal inputted from the first stage 310 to the second sub-A/D converter circuit 322 can be matched with the reference voltage range.

The second sub-A/D converter circuit 322 converts the components corresponding to the upper fifth and sixth bits in the sampled signal, into digital values so as to be outputted to the second D/A converter circuit 324 and the digital signal processing unit 350 by adding the redundancy 1 bit thereto. The second D/A converter circuit 324 converts the digital values of the second sub-A/D converter circuit 322 into an analog value.

The second subtraction circuit 326 subtracts the analog signal converted by the second D/A converter circuit 324, from the residual signal of the first stage 310 which has been sampled by the third amplifier circuit AMP3. The fourth amplifier circuit AMP4 amplifies a residual signal obtained by subtracting the former from the latter, by a predetermined gain and then outputs the amplified residual signal to the second stage 320. Here, the signal was amplified by a factor of 2.

The third stage 330 includes a third sub-A/D converter circuit 332, a third D/A converter circuit 334, a third subtraction circuit 336, a fifth amplifier circuit AMP5 and a sixth amplifier circuit AMP6. The third stage 330 converts the components corresponding to the upper seventh and eighth bits into digital values. The structure and operation of the third stage 330 are similar to those of the second stage 320 and therefore the repeated explanation is omitted here.

The fourth stage 340 includes a fourth sub-A/D converter circuit 342. The fourth sub-A/D converter circuit 342 converts the residual signal inputted from the third stage 330, into digital values. That is, the fourth stage 340 converts the components corresponding to the upper ninth and tenth bits into digital values.

The digital signal processing unit 350 receives output digital values of all the stages 310, 320, 330 and 340, then separates the redundancy bits therefrom and constructs a 10-bit digital value. Also, the digital signal processing unit 350 converts a Gray-coded digital value outputted from each stage into a binary-coded digital value.

The comparator 200 shown in FIG. 3 can be suitably used for the sub-A/D converter circuits 312, 322, 332 and 342 in the A/D converter 300.

Figure 7:
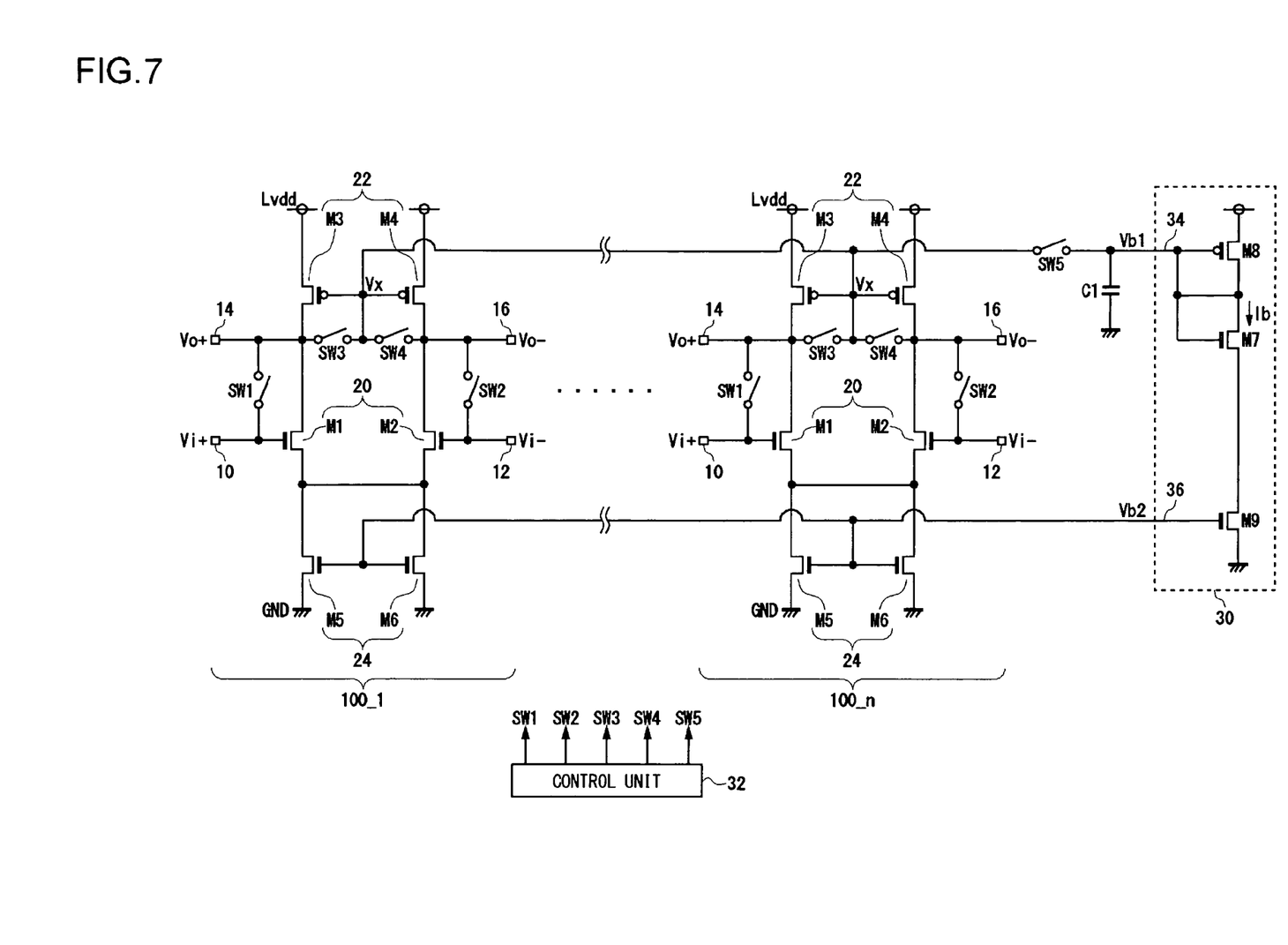
FIG. 7 is a circuit diagram showing a configuration of a plurality of differential amplifiers provided within a comparator of an A/D converter shown in FIG. 6.

Further, in a circuit configuration having a plurality of differential amplifiers 100 or comparators 200, a structure may be such that the bias circuit 30 and the external bias switch SW5 are shared in the plurality of differential amplifiers 100 or comparators 200. In such a case, the circuit area can be reduced. FIG. 7 is a circuit diagram showing a configuration of a plurality of differential amplifiers 100 provided in the comparator 200 of the A/D converter shown in FIG. 6.

In a preferred embodiment, a plurality of differential amplifiers 100_1 to 100_n (hereinafter generically referred to as "differential amplifiers 100" also) are provided in the comparators of the sub-A/D converter circuits 312, 322, 332 and 342, respectively. A single bias circuit 30, a stabilizing capacitor C1, an external bias switch SW5 and a control unit 32 are shared by a plurality of differential amplifiers 100. A first common bias voltage Vb1 generated by the single bias circuit 30 is supplied to load current sources 22 which function as loads of differential pair transistors 20 in a plurality of differential amplifiers 100_1 to 100_n, respectively.

When noise accumulates to the bias of the differential amplifier of each comparator in the A/D converters provided with a plurality of comparators shown in FIG. 6, a problem arises where the accuracy of A/D conversion deteriorates and so forth. Applying the circuits of FIG. 1 and FIG. 3 to such A/D converters achieves a highly accurate A/D conversion.

When noise accumulates to the bias of the differential amplifier of each comparator in the A/D converter shown in FIG. 6, a problem arises where the accuracy of A/D conversion deteriorates and so forth. By applying the circuits of FIG. 1 and FIG. 3 to such an A/D converter, the noise can be suitably removed and therefore high-speed and highly accurate A/D conversion can be realized.

Figure 8:
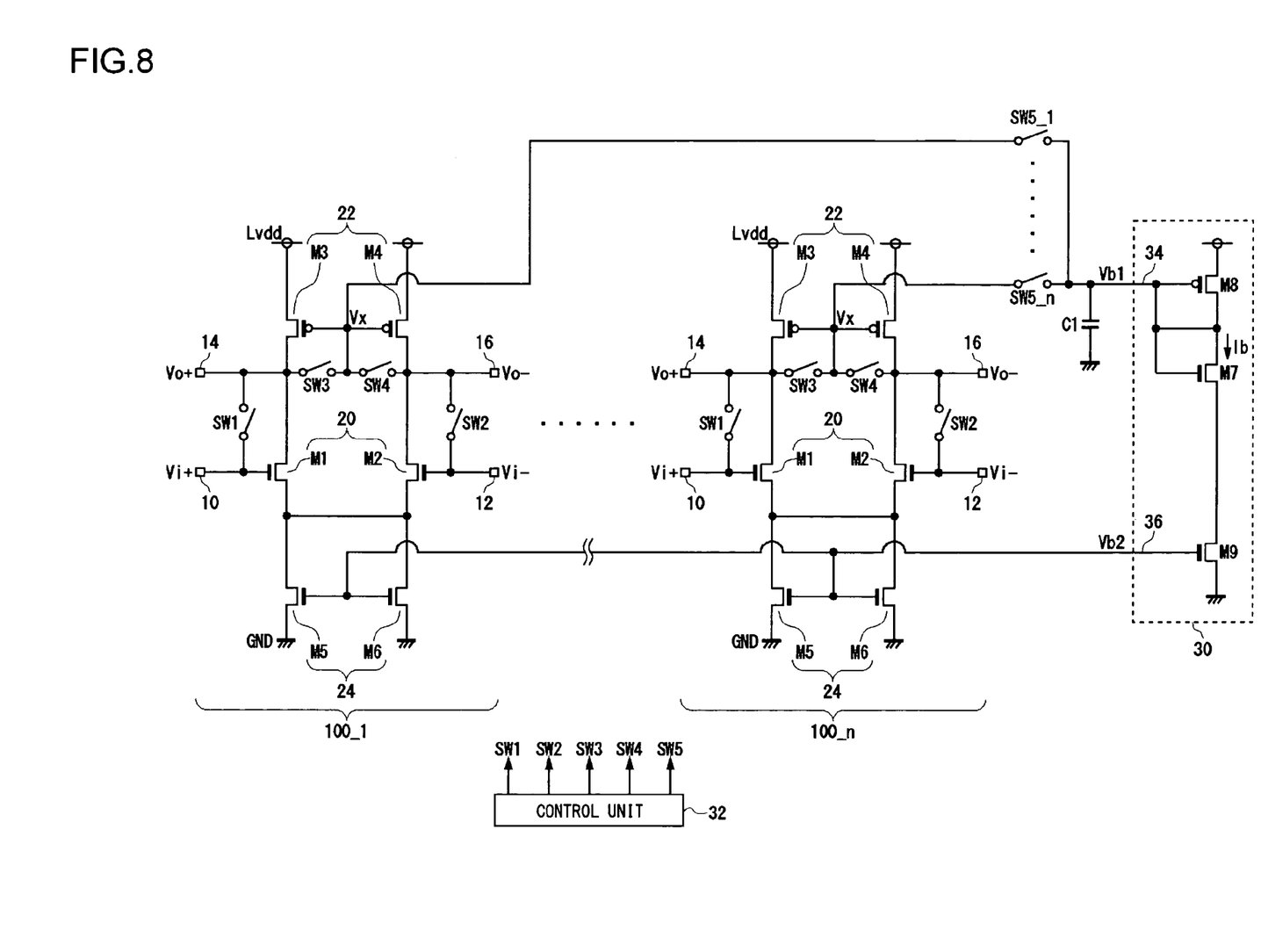
FIG. 8 is a circuit diagram showing a modification of the configuration shown in FIG. 7.

FIG. 8 is a diagram showing a modification of the configuration shown in FIG. 7. In the circuit shown in FIG. 7, the external bias switch SW5 is commonly used by a plurality n of differential amplifiers 100_1 to 100_n. In the modification shown in FIG. 8, the external bias switch SW5 is provided for each of differential amplifiers 100_1 to 100_n. The first common bias voltage Vb1 generated by the single bias circuit 30 is supplied to each load current source 22 which functions as a load of each of the differential pair transistors in each of a plurality of differential amplifiers 100_1 to 100_n, by way of each of external bias switches SW5_1 to SW5_n. By employing this modification, the noise can be suitably removed and high-speed and highly accurate A/D conversion can be realized, too.

Further, the provision of a plurality of external bias switches SW5 makes it possible for a plurality of external bias switches SW5 to operate at independence phases. That is, the on-off timing of the external bias switches SW5_1 to SW5_n can be controlled independently according to the operation timing of each differential amplifier 100. For example, in the A/D converter 300 shown in FIG. 6, a set of the first amplifier circuit AMP1, the third amplifier circuit AMP3 and the fifth amplifier circuit AMP5 operates in-phase, whereas a set of the second amplifier circuit AMP2, the fourth amplifier circuit AMP4 and the sixth amplifier circuit AMP6 are in reverse phase. In this case, it is preferable that the external bias switches SW5_1, SW5_3 and SW5_3 connected to the amplifier circuits AMP1, AMP3, AMP5 be turned on and off in-phase, whereas the external bias switches SW5_2, SW5_4 and SW5_6 connected to the amplifier circuits AMP2, AMP4, AMP6 be turned on and off in reverse phase.

In another preferred embodiment, a plurality of differential amplifiers 100_1 to 100_n may be applied to the first amplifier circuit AMP1 to the sixth amplifier circuit AMP6.

The above-described embodiments are merely exemplary and it is understood by those skilled in the art that various modifications to the combination of each component and process thereof are possible and such modifications are also within the scope of the present invention.

In the differential amplifier 100 shown in FIG. 1, a structure is implemented where the external bias switch SW5 is provided between the load current source 22 and the bias circuit 30. However, this should not be considered as limiting and, for example, a structure may be implemented where a second external bias switch may be provided between the tail current source 24 and the bias circuit 30, in place of or in addition to the load current source 22.

Figure 9:
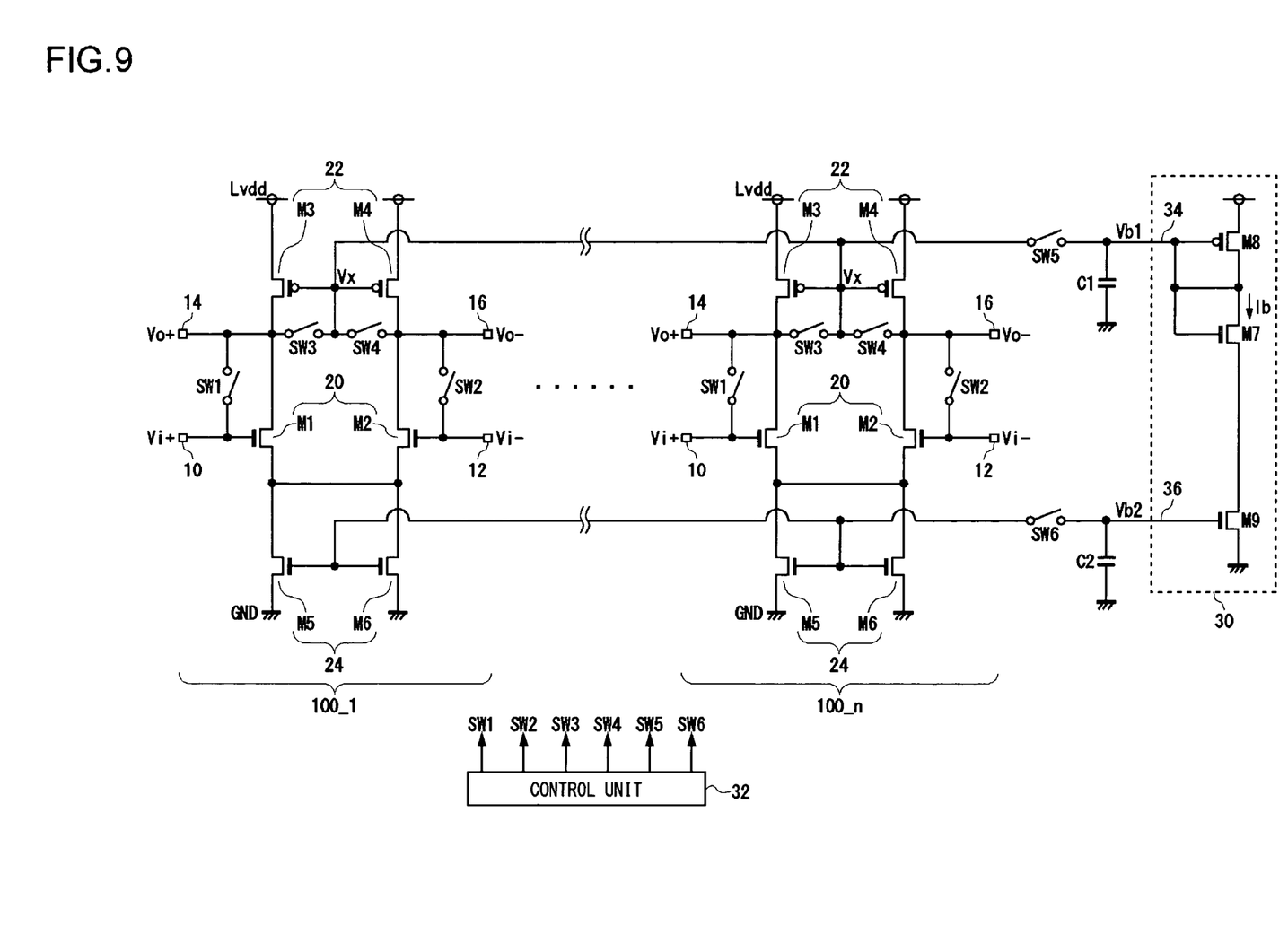
FIG. 9 is a circuit diagram showing another modification of the configuration shown in FIG. 7.

FIG. 9 is a circuit diagram showing another modification of the configuration shown in FIG. 7. In addition to the circuit of FIG. 7, the differential amplifier according to this modification further includes a second external bias switch SW6 and a stabilizing capacitor C2. The stabilizing capacitor C2 is provided between the second output terminal 36 of the bias circuit 30 and ground. The second bias voltage Vb2 is stabilized by the stabilizing capacitor C2.

A single bias circuit 30 generates the first bias voltage Vb1 common to the respective load current sources 22 of a plurality of differential amplifiers 100_1 to 100_n and the second bias voltage Vb2 common to the tail current sources 24 of the plurality of differential amplifiers 100_1 to 100_n. The first common bias voltage Vb1 is supplied to the plurality of load current sources 22 via the single external bias switch SW5 which is used commonly. Also, the second common bias voltage Vb2 is supplied to the plurality of tail current sources 24 via the second single external bias switch SW6 which is used commonly.

More specifically, the second external bias switch SW6 is provided between the gates of the first tail transistor M5 and second tail transistor M6 and the second output terminal 36 of the bias circuit 30.

One end of the second external bias switch SW6 is connected to the output terminal 36 of the bias circuit 30, namely, the gate of the third bias transistor M9. The other end of the second external bias switch SW6 is connected to the gate, connected in common, of the first tail transistor M5 and the second tail transistor M6 that constitute the tail current source 24. When the second external bias switch SW6 is ON, the second bias voltage Vb2 generated by the bias circuit 30 is supplied to the tail current source 24 so as to control the bias state of the first tail transistor M5 and second tail transistor M6. The on-off timing of the second external bias switch SW6 is preferably set identical to that of the external bias switch SW5.

Similar to the differential amplifier 100 of FIG. 1, when the tail current source 24 is operated by the internal self-bias, the external bias switch is turned off in this modification. This can prevent the potential at the gate of the third bias transistor M9 of the bias circuit 30 from suffering from the effect of the gate potential of the first tail transistor M5 and second tail transistor M6. As a result, when the tail current source 24 is operated by the external second bias voltage Vb2, the gate potential of the first tail transistor M5 and second tail transistor M6 can be immediately stabilized to a predetermined second bias voltage Vb2 and therefore high-speed signal processing can be realized.

Though FIG. 9 shows an example where the second single external bias switch SW6 is shared, the present invention is not limited thereto and the second external bias switch SW6 may be provided for each of the tail current sources 24 in the differential amplifiers 100.

A description has been given of a case where a differential transistor pair 20 is constituted by N-channel MOSFETs in the differential amplifier 100. These may be constituted by P-channel MOSFETs. In such a case, the supply voltage and the ground voltage are reversed and the P-channel and the N-channel are interchanged. Also, another type of transistors such as bipolar transistors may be used as part of the transistors.

In the differential amplifier 100 shown in FIG. 1, the bias circuit 30 is configured as a replica equivalent to the differential transistor pair 20, the load current source 22 and the tail current source 24. However, this should not be considered as limiting, and the first bias voltage Vb1 and the second bias voltage Vb2 may be generated by a bias circuit implementing another structure.

In the differential amplifier 100 shown in FIG. 1, the third self-bias switch SW3 and the fourth self-bias switch SW4 are provided but these switches may be omitted. Alternatively, a switch may be provided between the drain of the first input transistor M1 and the drain of the second input transistor M2, in place of the third self-bias switch SW3 and the fourth self-bias switch SW4.

Further, the structure of the differential amplifier 100 is not limited to the structure as shown in FIG. 1, and a resistance load may be used instead of the current-mirror load or another structure may be implemented. In this case, too, a structure will be such that an external bias switch is provided between the current source connected with the differential transistor pair 20 and the bias circuit 30 and therefore the same advantageous effects as those described in the above embodiments can be obtained.

Figure 10:
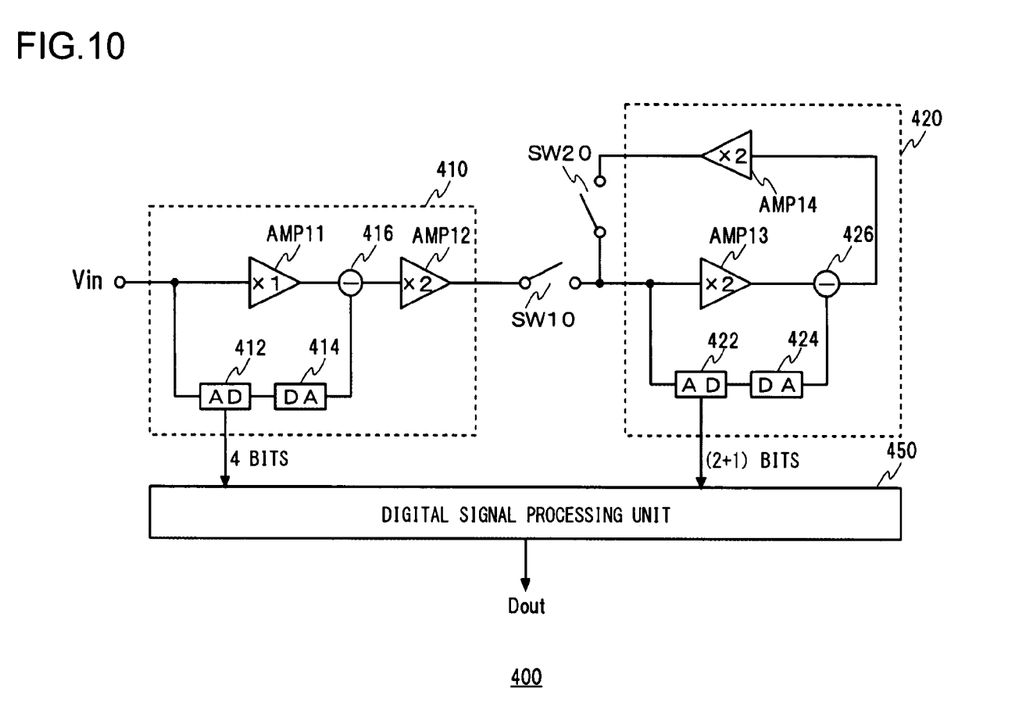
FIG. 10 is a block diagram showing a structure of an A/D converter which may use a differential amplifier of FIG. 1 and/or a comparator of FIG. 3.

FIG. 10 is a block diagram showing a structure of an A/D converter which may use a differential amplifier 100 of FIG. 1 and/or a comparator 200 of FIG. 3. An A/D converter 400 shown in FIG. 10, which is a cyclic A/D converter, includes two stages 410 and 420. The first stage 410 performs 4-bit conversion, whereas the second stage 420 performs 2-bit conversion excluding the redundancy 1 bit. The second stage 420 rotates a residual signal from the first stage three times so as to perform 4-bit or 6-bit conversion in the first stage 410. Accordingly, the this cyclic A/D converter 400 performs 4-bit conversion in the first stage 410 and 6-bit conversion in the second stage 420 so as to perform the conversion of the total of 10 bits. Note that the number of stages and the number of bits described above are merely exemplary and are not limited thereto. Also conceivable is a structure where the signal is rotated a plurality of times in one stage.

The structure of the first stage 410 is similar to that of the first stage 310 of the A/D converter 300 shown in FIG. 6 and thus the repeated explanation thereof is omitted here. The second stage 420 includes a sample amplifier circuit AMP13, in addition to the second stage 320 shown in FIG. 6. The sample amplifier circuit AMP13 samples a residual signal from the first stage 410 or a residual signal fed back from the second stage 420 at a substantially same timing as that of the second sub-A/D converter circuit 422.

The sample amplifier circuit AMP13 amplifies the sample residual signal by a predetermined gain. In the example of FIG. 10, the signal is amplified by a factor of 2. Note that in the case of the unity gain, the sample amplifier circuit AMP13 functions as a sample-and-hold circuit. A second subtraction circuit 426 subtracts an analog signal converted in the second D/A converter circuit 424, from the residual signal which has been sampled and amplified by the sample amplifier circuit AMP13. A second amplifier circuit AMP14 amplifies a residual signal, where the former is subtracted from the latter, by a predetermined gain and then the amplified signal is fed back to the input of the second stage 420.

In FIG. 10, the reference voltage of each comparator provided within the second sub-A/D converter circuit 422 can be set in the same manner as in the first sub-A/D converter circuit 412. Even if the reference voltage is set in the same manner as in the first sub-A/D converter circuit 412, the residual signal sampled by the sample amplifier circuit AMP13 will be amplified by a factor of 2. Thus, the range of residual signals inputted to the second sub-A/D converter circuit 422 can be matched with the reference voltage range.

In the cyclic A/D converter 400 shown in FIG. 10, a first input switch SW10 and a second input switch SW20 are provided between the first stage 410 and the second stage 420. The first input switch SW10 and the second input switch SW20 turn on and off in a complementary manner.

When the first input switch SW10 is ON and the second input switch SW20 is OFF, the residual signal from the first stage 410 is inputted to the sample amplifier circuit AMP13 and the second sub-A/D converter circuit 422. On the other hand, when the first input switch SW10 is OFF and the second input switch SW20 is ON, the residual signal fed back from the second stage 420 is inputted to the sample amplifier circuit AMP13 and the second sub-A/D converter circuit 422.

The differential amplifier 100 of FIG. 1 or the comparator 200 of FIG. 3 can be suitably used for the sub-A/D converter circuits 412 and 422 of FIG. 10. In such a case, as shown in FIG. 6, a plurality of differential amplifiers 100 provided in the sub-A/D converter circuits 412 and 422 may be implemented using any of exemplary embodiments shown in FIG. 6 to FIG. 10. Similarly, the differential amplifier 100 of FIG. 1 or the comparator 200 of FIG. 3 can be suitably used for the amplifier circuits AMP11, AMP12, AMP13 and AMP14 in the A/D converter 400 shown in FIG. 10.

While the preferred embodiments of the present invention have been described using specific terms, such description is for illustrative purposes only, and it is to be understood that changes and variations may be made without departing from the spirit or scope of the appended claims.

What is claimed is:

1. A differential amplifier, comprising:
   a differential transistor pair;
   at least one current source connected to said differential transistor pair;
   a bias circuit which supplies a bias voltage to said current source and which controls current generated by said current source;
   a first self-bias switch and a second self-bias switch each provided between an input terminal and an output terminal of each of transistors that constitute said differential transistor pair; and
   an external bias switch provided on a path of bias voltage supplied from said bias circuit to said current source.

2. A differential amplifier according to claim 1, wherein said external bias switch is provided between said current source functioning as a load of said differential transistor pair and said bias circuit.

3. A differential amplifier according to claim 2, wherein said current source functioning as a load of said differential transistor pairs includes a load transistor pair where a control terminal is connected in common,
   wherein said external bias switch is provided between the control terminal of the load transistor connected in common and said bias circuit,
   wherein said differential amplifier circuit further comprises: a third self-bias switch provided between the control terminal of the load transistor pair in common and an output terminal of one of transistors that constitute the differential transistor pair; and a fourth self-bias switch provided between the control terminal of the load transistor pair in common and an output terminal of the other of transistors that constitute the differential transistor pair.

4. A differential amplifier according to claim 1, wherein said external bias switch is provided between said current source functioning as a tail current source of said differential transistor pair and said bias circuit.

5. A differential amplifier according to claim 1, wherein, in a predetermined self-bias period, said first self-bias switch and said second self-bias switch are turned on and said external bias switch is turned off and, in a predetermined amplifying period thereafter, said first self-bias switch and said second self-bias switch are turned off and said external bias switch is turned on.

6. A switched-capacitor circuit, comprising:
   a differential amplifier according to claim 1;
   an input capacitor connected to an input terminal of said differential amplifier; and
   an input switch which is on-off controlled by said input capacitor wherein one end of said input switch is connected to said input capacitor.

7. A differential amplifier comprising a plurality of differential amplifiers according to claim 2,
   wherein a single bias circuit is shared by the plurality of differential amplifiers, and
   a common bias voltage generated by the single bias circuit is supplied to said current sources functioning as loads of said differential transistor pair in the plurality of differential amplifiers, via a single bias switch shared by the plurality of differential amplifiers.

8. A differential amplifier comprising a plurality of differential amplifiers according to claim 2,
   wherein a single bias circuit is shared by the plurality of differential amplifiers, and
   a common bias voltage generated by the single bias circuit is supplied to said current sources functioning as loads of said differential transistor pair in the plurality of differential amplifiers, via a plurality of external switches provided for the plurality of differential amplifiers, respectively.

9. A differential amplifier comprising a plurality of differential amplifiers according to claim 1,
   wherein a single bias circuit is shared by the plurality of differential amplifiers, and
   the single bias circuit generates a first common bias voltage supplied to said current sources functioning as loads of said differential transistor pair in the plurality of differential amplifiers and generates a second common bias voltage supplied to said current sources functioning as tail current sources of said differential transistor pair in the plurality of differential amplifiers,
   wherein the first common bias voltage generated by the single bias circuit is supplied to said current sources functioning as loads of said differential transistor pair in the plurality of differential amplifiers, via a first single external switch shared by the plurality of differential amplifiers, and
   wherein the second common bias voltage generated by the single bias circuit is supplied to said current sources functioning as tail current sources of said differential transistor pair in the plurality of differential amplifiers, via a second single external switch shared by the plurality of differential amplifiers.

* * * * *